United States Patent
Hupe et al.

(10) Patent No.: US 6,589,593 B1
(45) Date of Patent: Jul. 8, 2003

(54) METHOD FOR METAL COATING OF SUBSTRATES

(75) Inventors: Jürgen Hupe, Langenfeld (DE); Sabine Fix, Wülfrath (DE); Ortrud Steinius, Wuppertal (DE)

(73) Assignee: Blasberg Oberflächentechnik GmbH, Solingen (DE)

( * ) Notice: Subject to any disclaimer, the term of this patent is extended or adjusted under 35 U.S.C. 154(b) by 0 days.

(21) Appl. No.: 09/674,510

(22) PCT Filed: May 14, 1999

(86) PCT No.: PCT/EP99/03322

§ 371 (c)(1), (2), (4) Date: Nov. 15, 2000

(87) PCT Pub. No.: WO99/60189

PCT Pub. Date: Nov. 25, 1999

(30) Foreign Application Priority Data

May 16, 1998 (DE) .......................................... 198 22 075

(51) Int. Cl.⁷ .............................. B05D 5/12; H05K 3/00
(52) U.S. Cl. .......................... 427/96; 427/97; 427/306; 427/307; 427/337; 205/125; 252/500
(58) Field of Search ........................... 427/96, 97, 307, 427/306, 383.1, 404, 337; 205/125; 252/500

(56) References Cited

U.S. PATENT DOCUMENTS

| 4,847,114 | A | * | 7/1989 | Brash et al. ................... 427/96 |
| 5,591,488 | A | * | 1/1997 | Schafer et al. .............. 427/307 |
| 5,620,800 | A | * | 4/1997 | De Leeuw et al. ......... 428/469 |
| 6,203,727 | B1 | * | 3/2001 | Babinec et al. ............. 252/500 |

FOREIGN PATENT DOCUMENTS

| DE | 38 06 884 C1 | | 9/1989 |
| DE | 195 02 988 A1 | | 8/1996 |
| DE | 19502988 | * | 8/1996 |

* cited by examiner

Primary Examiner—Brian K. Talbot
(74) Attorney, Agent, or Firm—Jacobson Holman PLLC

(57) ABSTRACT

A process for coating substrates having polymer surfaces with metals in the manufacturing of printed circuit boards, in particular in the manufacturing of printed circuit boards having microscopic holes and fine geometries by the application of an electroconductive polymer layer and a subsequent metallization, wherein the electroconductive polymer layer is preferably doped with a zinc-containing, colloidal palladium solution prior to the metallization step, the electroconductive polymer is poly-3,4-ethylenedioxythiophene and a contacting with a copper(II) salt solution is performed prior to the metallization.

7 Claims, No Drawings

METHOD FOR METAL COATING OF SUBSTRATES

The invention pertains to a process for coating substrates having polymer surfaces with metals in the manufacturing of printed circuit boards, in particular in the manufacturing of printed circuit boards having microscopic holes and fine geometries by the application of an electroconductive polymer layer and a subsequent metallization, wherein the electroconductive polymer layer is preferably doped with a zinc-containing, colloidal palladium solution prior to the metallization step. In particular, printed circuit boards having microscopic holes and fine geometries are produced in the so-called build-up technology. Generally, in this technique circuits finished on both sides are used as a core and coated with polymers wherein microscopic holes are made in accordance with the state of the art, e.g., by photolithography or by lasers, said microscopic holes leading to the next conductor level as so-called blind vias.

Subsequently, a surface patterning of the polymer, a seeding with Pd, and a surface metallization of the complete circuit by electroless deposition of copper are performed according to the state of the art described in DE A 195 02 988. Optionally, the "chemical" copper layer is reinforced electrolytically.

In additional operating steps the conductor pattern having appropriate conductor runs is formed. Multilayers having a higher number of layers can be prepared by repeating this procedure several times. Therefore, this process is designated as a sequential build up.

From DE 38 06 884 a process for the formation of via holes in printed circuit boards (i.e., the metallization of bore walls) on the basis of intrinsically conducting polymers has been known. The substrate is pre-treated in an oxidizing solution, rinsed, and subsequently dipped in an aqueous monomer solution of pyrrole, furan, thiophene, and/or derivatives thereof, and an after-treatment in acidic solutions is performed. In this process an intrinsically conducting polymer film is selectively formed on electrically non-conducting surfaces (polymer, glass etc.) and subsequently galvanically metallized.

In the metallization of bore walls distances corresponding to the thickness of the printed circuit boards have to be bridged. Generally, distances exceeding 4 mm will have to be metallized only rarely. The conductivity of the intrinsically conducting polymers will generally be sufficient to complete the metallization within several minutes. The lateral growth of copper on said polymers will vary between 0.1 and 2.5 mm/min depending on the polymer type. Assuming such growth values, a surface metallization of complete printed circuit boards having surfaces of up to 0.2 m$^2$—and optionally exceeding that value—can be achieved not at all or only after a long time with a very poor layer thickness distribution. Such printed circuit boards meet the technical demands not in the slightest. Therefore, it will be necessary to increase the conductivity of such intrinsically conducting polymers distinctly and to increase the lateral metal growth on said polymer films considerably.

In DE 195 02 988 there is described a process which is to solve the problems illustrated above. According to the process described in DE 38 06 884, initially the substrate polymer is applied with an electroconductive polymer. Prior to the galvanic metallization a treatment in an metal-ion containing aqueous solution, preferably a tin-containing colloidal palladium solution is performed. In this step the intrinsically conducting polymer is additionally doped. Thus, improved conductivity values and, above all, an increased lateral growth can be achieved. In the case of, e.g., poly-3,4-ethylenedioxythiophene metal growth values of up to 5 mm/min can be realized. However, also these values are still not satisfactory for a surface metallization. The adhesion of the conducting polymer to the substrate polymer is insufficient. Namely, the conductive polymer film has to be provided such that it strongly adheres to the substrate polymer. Hence, adhesive strength values of at least 5 N/cm, preferably, however, of 10 N/cm will be necessary.

Therefore, the objects of the present invention are to provide a sufficient adhesion of the conducting polymer film to the polymer substrate and, above all, to further increase the lateral growth of copper.

Said objects are achieved by a contacting with a copper (II) salt solution prior to the metallization. Preferably, the substrate surfaces are subjected to the following steps at least once prior to the application of the electroconductive polymer layer:

a) Swelling by aqueous leaches, organic solvents, or alkaline solvents;
b) treating with an alkaline permanganate solution; and
c) treating with a reducing agent.

Hence, the substrate surface is initially patterned. This is performed in step a) by the treatment with a swelling agent, a mixture of suitable solvents, and by a sodium or potassium hydroxide solution. Subsequently, the surface of the substrate polymer pre-treated this way is further patterned in an alkaline permanganate solution. In this step as much cavities as possible being distributed over the complete surface as evenly as possible and having diameters of some few μm or even smaller are to be formed in order to improve the adhesion of the conducting polymer. Such swelling agents and alkaline permanganate solutions have been known from, e.g., the so-called multilayer desmear process. It has been unknown that the adhesive strength of the conduction polymer layer can considerably be improved by these steps.

Depending on the substrate polymer it is advantageous to perform the swelling and permanganate treatment process several times in order to achieve an appropriate surface patterning. In any case, the last step of the process is a reducing process wherein the residues of the permanganate treatment, namely manganese dioxide, are reduced and hence the surface is made residue-free again. In particular, $H_2O_2$ has been proved especially efficient as a reducing agent.

When carrying out the inventive process, the swelling of the substrate polymer is performed using a solvent or a solvent mixture to which optionally or even preferably an alkali hydroxide is added. Subsequently, the treatment with alkaline permanganate solution follows. These measures result in a uniform roughening and patterning of the substrate polymer and ensure a good adhesion of the conducting polymer layer which is to be applied subsequently.

It turned out that especially good adhesion strength values can be obtained if the polymer substrates are subjected to a mechanical pretreatment prior to the chemical treatment. For this brushing, sandblasting or also preferably a treatment with pumice powder is suited, the latter process being known as "pumice brushing" or "pumice blasting". The adhesion strength can further be increased by about 30 to 40% by this process.

In principle, the formation of the conductive polymer layer takes place as described in DE 38 06 884.

The surface which is pretreated according to the invention and with that patterned is initially pretreated in an oxidizing bath, preferably a solution of potassium permanganate within a pH range from 1 to 14, preferably from about 5 to 8. In order to improve the adhesion of the polymer film to be formed, the oxidizing step may be preceded by an immersion in a so-called conditioner according to the description in DE-A-42 05 190.

Subsequently, a rinsing is performed and the substrate is immersed in a monomer solution of 3,4-ethylenedioxythiophene. Subsequently, the substrate covered with the monomer is inserted into an acidic solution without rinsing prior to the insertion, the formation of the conducting polymer films taking place within the acidic solution via an oxidative polymerization. In the case of potassium permanganate as the oxidant, a layer of manganese dioxide is formed in the first step as the reaction product of the substrate polymer and $KMnO_4$, wherein said layer of manganese dioxide is polymer-impregnated and acts as an oxidant in the acidic solution described above.

As acids preferably sulfuric, phosphoric, or sulfonic acids are used; especially preferred are, e.g., polyphosphoric acids or polymeric sulfonic acids. In an especially preferred embodiment of the invention polystyrene sulfonic acid or salts thereof are used.

The electric resistance of the so-formed conducting polymer layer is generally from about 5 to 500 kΩ depending on the working parameters and, above all, the used acid and the used monomer compound. Here, the resistance is measured through a bore in a printed circuit board. In this measurement, the plate has a thickness d=1.6 mm, and the diameter of the bore is 1.0 mm.

The lowest resistance values are achieved when using 3,4-ethylene-dioxythiophene and polystyrene sulfonic acid.

The lateral growth of copper has a crucial influence on the metallization of larger surfaces. With the use of 3,4-ethylenedioxythiophene and polystyrene sulfonic acid optimum values of up to 3.0 mm/min are achieved. However, this is not sufficient for surface depositons. Thus, according to the inventive process initially an after-treatment according to DE A 195 02 988 comprised of a doping using a tin-containing, colloidal palladium solution is performed in order to improve the lateral growth of copper.

For this purpose the substrate coated with the conducting polymer is dipped in such a metal-containing solution. Said solution is a colloidal palladium solution using tin(II) salts as colloid stabilizers. For years such palladium "catalysts" have been used in the chemical metallization of plastic substrates as activating solutions. However, the solutions employed according to the invention may contain higher palladium concentrations than normal, namely, instead of about 50 mg/l up to several g/l.

By this after-treatment the conducting polymer film is covered with the metal, namely Pd and $Sn^{2+}$. Subsequent to a rinsing process the plate covered this way is dipped in a copper(II) salt solution optionally containing a complexing agent, a stabilizer, and pH correcting agents. During this process the deposition of copper on the conducting polymer film seems to occur in an ionic exchange. This results not only in a reduction of the electric resistance but also in an improvement of the lateral growth of copper. Due to the inventive combination of conducting polymer, metal doping, and contacting with a copper(II) salt solution the lateral growth of copper is increased from 2.5 mm/min up to 40 mm/min and more; this enables the subsequent electrolytic metallization, e.g., a copper plating also of larger surfaces in an sufficiently short time with a uniform metal distribution over the surface of the substrate and a good adhesion.

Presumably, due to the additional incorporation of metal the formation of germs during the metallization proceeds distinctly faster and therefore a faster lateral growth is realized.

The inventive process steps are preferably as follows:

| | | | |
|---|---|---|---|
| 1. | Swelling | T: 40–85° C. | t: 0.5–15 min |
| | Rinsing | | |
| 2. | Alkaline $KMnO_4$ | T: 60–95° C. | t: 1–30 min |
| | Rinsing | | |
| 3. | Reduction | T: 20–45° C. | t: 0.2–5 min |
| | Rinsing | | |

Optionally, this process may be repeated—if required also several times—completely or only partially.

| | | | |
|---|---|---|---|
| 4. | Conditioner | T: 20–60° C. | t: 0.1–5 min |
| | Rinsing | | |
| 5. | $KMnO_4$ (pH 1–14) | T: 50–95° C. | t: 0.3–10 min |
| 6. | Rinsing | | |

Optionally, a rinsing sequence employing water, a solution of sulfuric acid (pH 1 to 5), water, a weakly alkaline solution (pH 7 to 9) and again water can be used.

| | | | |
|---|---|---|---|
| 7. | Monomer | T: 10–40° C. | t: 0.3–7 min |
| 8. | Acid | T: 10–40° C. | t: 0.3–10 min |
| 9. | Metal solution I (tin-containing colloidal palladium solution) Rinsing | T: 20–70° C. | t: 0.2–10 min |
| 10. | Metal solution II (copper(II) salt solution) Rinsing | T: 20–80° C. | t: 0.2–10 min |
| 11. | Optionally drying or annealing | | |
| 12. | Pickling (5–10% acid) Optionally rinsing | T: 20–30° C. | t: 0.1–5 min |
| 13. | Electrolytic metallization | | |

Generally, the metallization is performed with current densities of about 0.5 to 10 $A/dm^2$ depending on the design of the facility (horizontally or vertically) during a period ensuring the desired metal layer is deposited.

Rinsing

14. Drying
15. Annealing

The so-treated polymer substrate has a uniform, high-adhesion strength metallization on a large, sheet-like structure (e.g., a printed circuit board having dimensions of 405×535 mm).

Optionally, the steps 7. and 8. may be combined to one step. Preferably the operation takes place horizontally.

The process will further be illustrated in the following examples.

EXAMPLES

All experiments have been performed using two different polymer substrates, on which the metallization has been performed. However, the inventive process is not limited to these polymer substrates.

Polymer A: epoxypolymer (standard FR-4 base material)

Polymer B: epoxypolymer (Probelec® XB7081, photodielectric);

Probelec® is a registered trademark of Ciba Speciality Chemicals Inc.)

The dimensions of the used substrates varied according to the objective of the experiment. Determination of the:

| | |
|---|---|
| lateral growth of copper: | 35 × 100 mm |
| adhesive strength: | 35 × 100 mm |
| metal doping: | a surface of 0,5 dm² |

I. Patterning of the Polymer Substrates

Each of the substrate sections was treated in the dipping process described hereinafter with slight agitation. The subsequent operating steps were also performed in dipping processes. It should expressly be noted that the inventive process can be performed in vertical or horizontal continuous systems with the same success. The same also applies for the galvanic metallization. Generally, the process time is distinctly reduced depending on the flooding parameters.

What is more, in the production the inventive process should preferably be performed in continuous systems. Since the process is in principle independent of dipping or continuous system designs, hereinafter only dipping processes will be described.

The operating steps, concentrations, temperatures, times, etc. and chemical components described below do not limit the invention but represent merely preferred embodiments.

| Pretreatment of Polymer A | | |
|---|---|---|
| 1. Swelling (aqueous solution of 330 ml/l N-methylpyrrolidone and 12 g/l NaOH) | T: 55° C. | t = 10 min |
| 2. Rinsing in water | T: RT | 2 × 1 min each |
| 3. Oxidation (aqueous solution of 65 g/l KMnO₄ and 40 g/l NaOH) | T: 80° C. | t = 12 min |
| 4. Rinsing in water | T: RT | 3 × 1 min each |
| 5. Reduction (aqueous solution of 50 ml/l H₂O₂, 35% and 50 ml/l H₂SO₄) | T:RT | t = 1 min |
| 6. Rinsing in water | T: RT | 2 × 1 min each |
| 7. Drying | | |

| Pretreatment for Polymer B | | |
|---|---|---|
| 1. Swelling Enplate MLB 2010* (solvent mixture with added NaOH) | T: 80° C. | t: 1 min |
| 2. Rinsing in water | T: RT | t = 5 min |
| 3. Oxidation (aqueous solution of 60 g/l KMnO₄ and 45 g/l NaOH) | T: 80° C. | t = 5 min |
| 4. Rinsing in water | T: RT | t = 5 min |
| 5. Reduction as described under Polymer A, item 5. | | |
| 6. Rinsing in water | T: RT | 2 × 1 min each |

In a preferred embodiment steps 3. to 6. are repeated with an increase of the time in step 3. to t=8 min. Subsequently a drying operation is performed.

If required, the process may be repeated several times.

Subsequent to the pretreatment procedure the polymer substrates have a uniform patterning with a multitude of small surface cavities (diameters of about 1 to 3 μm). The surface patterned this way provides a good adherend surface for the conducting polymer to be applied subsequently.

II. Coating with a Conducting Polymer

As the conducting polymer layer poly-3,4-ethylenedioxythiophene (poly EDT) is selected since the best results have been obtained therewith.

A total of 4 different process sequences have been tested.

| Sequence 1 | | |
|---|---|---|
| 1. Conditioner (according to DE A 42-05 190) Blasolit V** | T: 40° C. | t = 1 min |
| 2. Rinsing in water | T: RT | 2 × 1 min each |
| 3. Oxidation (aqueous solution of 70 g/l KMnO₄. The pH is adjusted to about 7 with diluted acid). | T: 80° C. | t = 2 min |
| 4. Rinsing in water | T: RT | 3 × 1 min each |
| 5. Monomer solution DMSE, CAT V-10 ** (contains about 1.5 EDT) | T: RT | t = 1 min |
| 6. Acid 6.1 Aqueous solution of 20 g/l of polystyrene sulfonic acid alternatively: 6.2 Aqueous solution with 150 g/l H₂SO₄ | T: RT | t = 1 min |
| 7. Rinsing in water | T: RT | 2 × 1 min each |
| 8. Drying | | |

\* A product of Enthone-OMI Inc.
\*\* A product of Blasberg Enthone-OMI, Germany

| Sequence 2 Steps 1 to 4 correspond to sequence 1. However, the conducting polymer film is formed in a single step. | | |
|---|---|---|
| 5. Polymerization solution (Aqueous solution of 0.12% EDT, 0.15% emulsifier (e.g., aryl polyglycol ether) and 0.4% polystyrene sulfonic acid) | T: rt | t = 3 min |
| 6. Rinsing in water | | |
| 7. Drying | | |

| Sequence 3 | | |
|---|---|---|
| 1. Solvent conditioner Condisolve HP** (according to DE A 42 05 190) | T: 55° C. | t = 8 min |
| 2. Rinsing in water | T: RT | 2 × 1 min each |
| 3. Oxidation (aqueous solution of 60 g/l KMnO₄ and 40 g/l NaOH. The KMnO₄ content is maintained at about 10–20 g/l). | T: 75° C. | t = 3 min |
| 4. Rinsing in water | T: RT | 3 × 1 min each |
| 5. Polymerization solution 5.1 Polymerization solution as described in sequence 2 | T: RT | t = 3 min |

| Sequence 3 |
| --- |
| 5.2 Aqueous solution of 0.3% EDT, 0.4% emulsifier, and 6 g/l polyphosphoric acid |
| 6. Rinsing in water |
| 7. Drying |

| Sequence 4 | | | |
| --- | --- | --- | --- |
| 1. | Solvent conditioner Condisolve HP** | T: 55° C. | t = 8 min |
| 2. | Rinsing in water | T: RT | 2 × 1 min each |
| 3. | Oxidation (see sequence 3, 3.) For the subsequent steps of the sequence see sequence 3. | T: 80° C. | t = 10 min |

III Aftertreatment of the conducting polymer layer with metal-containing solutions

| Variant 1 (according to DE 195 02 988) | | | |
| --- | --- | --- | --- |
| 1. | HCl, aqueous 8% solution | T: RT | t = 2 min |
| 2. | Metal-containing solution I. Colloidal Pd solution containing 1 g/l palladium 20 g/l tin(II) chloride, and 8% HCl | T: RT | t = 5 min |
| 3. | HCl, aqueous 8% solution | T: RT | t = 2 min |
| 4. | Rinsing in water | | |
| 5. | Drying | | |

| Variant 2 | | | |
| --- | --- | --- | --- |
| 1. | Metal-containing solution I. ABC 888 *** (colloidal Pd solution containing about 300 mg/l Pd; colloid stabilizer: tin(II) chloride) | T: 45° C. | t = 4 min |
| 2. | Rinsing in water | T: RT | 2 × 1 min each |
| 3. | Accelerating ABS 580 S *** | T: 45° C. | t = 1 min |
| 4. | Rinsing in water | T: RT | 2 × 1 min each |
| 5. | Drying | | |

| Variant 3 | | | |
| --- | --- | --- | --- |
| 1. | Metal-containing solution I. ABC 888 *** (see above) | T: 45° C. | t = 4 min |
| 2. | Rinsing | | |

| Variant 3 | | | |
| --- | --- | --- | --- |
| 3. | Metal-containing solution II (aqueous solution of 5 g/l $CuSO_4 \times 5\ H_2O$, 50 g/l $Na_2CO_3$, 50 g/l NaOH, 30 g/l potassium sodium tartrate | T: 63° C. | t = 5 min |
| 4. | Rinsing in water | T: RT | 2 × 1 min each |
| 5. | Drying | | |

The described concentrations, times, temperatures, and chemical components do not limit the scope of the inventive process but represent merely preferred embodiments of the process.

*** A product of APT, Advanced Plating Technologies, Israel

IV. Metallization of the Polymer Substrates Treated According to the Invention Since the copper plating of such substrates has an outstanding significance, hereinafter only the electrolytic copper plating as a metallization process will be described.

As copper plating electrolytes any commercially available copper process may be used. Since a CUPROSTAR LP-1 ** mat copper electrolyte has proven to be especially suitable, said electrolyte is referred to exemplarily.

The substrates are initially pickled in an aqueous solution of sulfuric acid (about 5 to 10% by volume) for 30 to 60 s and then copper-plated in the CUPROSTAR LP-1 copper electrolyte.

| Electrolyte composition: | |
| --- | --- |
| Copper | 20 g/l |
| $H_2SO_4$ | 200 g/l |
| NaCl | 100 mg/l |
| Additive LP-1 ** | 4 ml/l |
| Current density: | 2 A/dm² |

The copper-plating times were different in the respective examples.

The results were good regardless of whether a normal direct current deposition or a pulse reverse deposition was employed. In the latter case a 100 mS cathodic and 1 mS anodic pulse cycle was adjusted, and in general higher anodic current density values (factors of 2 to 3:1) were adjusted.

The results and conditions of the respective examples (examples 1 to 26) are shown in the table given below. It can clearly be seen that the doping with metal ions, in particular with tin-containing, colloidal palladium solutions results in a distinctly increased lateral growth. Under theses conditions even larger surfaces can be metallized in a shorter time.

The adhesive strength values obtainable with the inventive pretreatment are acceptable as well.

Examples 27/28

The test sequence of examples 22 and 25 is repeated except that the chemical patterning is preceded by a pumice powder treatment.

| | |
|---|---|
| Throughput speed: | 3.5 m/min |
| Residence time: | about 15 s |
| Substance: | 2/ON |
| | (a product of Vogel und Prenner Company) |

Under theses conditions adhesive strength values of about 10 N/cm are achieved.

| Exam-ple | Pretreatment according to: | Polymer coating according to: | Aftertreatment according to: | Polymer substrate | Resistance (KΩ) | Lateral growth of Cu [mm/min] | Metal doping [mg/dm²] Pd | Metal doping [mg/dm²] Cu | Adhesive strength [N/cm] |
|---|---|---|---|---|---|---|---|---|---|
| 1 | None | Sequence 1/6.1 | None | A | 5,5 | 2,8, | — | — | — |
| 2 | None | Sequence 1/6.2 | None | A | 4,0 | 2,2 | — | — | — |
| 3 | Polymer A | Sequence 1/6.1 | None | A | 27,0 | 2,5 | — | — | — |
| 4 | None | Sequence 2 | None | A | 8,7 | 5,4 | — | — | — |
| 5 | None | Sequence 4/5.1 | None | A | 4,3 | 4,9 | — | — | — |
| 6 | None | Sequence 4/5.2 | None | A | 11,0 | 3,8 | — | — | — |
| 7 | Polymer A | Sequence 4/5.1 | None | A | 10,0 | 3,1 | — | — | — |
| 8 | None | Sequence 1/6.1 | Variant 1 | A | 11,0 | 3,1 | 0,48 | — | — |
| 9 | None | Sequence 1/6.2 | Variant 1 | A | 15,0 | 2,3 | 0,20 | — | — |
| 10 | None | Sequence 1/6.1 | Variant 3 | A | 8,4 | 16,6 | 0,68 | 1,16 | — |
| 11 | None | Sequence 1/6.2 | Variant 3 | A | 18,0 | 9,3 | 0,28 | 0,76 | — |
| 12 | None | Sequence 1/6.1 | Variant 2 | A | 49,0 | 3,5 | 0,48 | — | — |
| 13 | None | Sequence 1/6.2 | Variant 2 | A | 140,0 | 7,3 | 0,28 | — | — |
| 14 | None | Sequence 4/5.1 | Variant 3 | A | 22,0 | >25,0 | 0,44 | 1,00 | — |
| 15 | None | Sequence 4/5.2 | Variant 3 | A | 55,0 | 20,6 | 0,12 | 0,52 | — |
| 16 | None | Sequence 4/5.1 | Variant 1 | A | 10,0 | 4,5 | 0,40 | — | — |
| 17 | None | Sequence 4/5.2 | Variant 1 | A | 40,0 | 6,8 | 0,76 | — | — |
| 18 | None | Sequence 1/6.1 | None | B | — | 6,0 | — | — | None |
| 19 | Polymer B | Sequence 1/6.1 | None | B | 7,7 | 6,3 | — | — | 4,0 |
| 20 | Polymer B | Sequence 1/6.1 | Variant 1 | B | 16,0 | 3,5 | 0,56 | — | 3,0 |
| 21 | Polymer B | Sequence 1/6.1 | Variant 2 | B | 125,0 | 22,4 | 0,12 | — | 1,3 |
| 22 | Polymer B | Sequence 1/6.1 | Variant 3 | B | 24,0 | 38,9 | 0,12 | 0,72 | 7,6 |
| 23 | None | Sequence 3/5.1 | None | B | — | 0 | — | — | None |
| 24 | Polymer B | Sequence 3/5.1 | None | B | 21,0 | 7,7 | — | — | 4,6 |
| 25 | Polymer B | Sequence 3/5.1 | Variant 3 | B | 300,0 | 28,6 | 0,20 | 0,35 | 10,3 |
| 26 | Polymer B | Sequence 2 | Variant 3 | B | 360,0 | 11 | 0,20 | 0,96 | 4,6 |

The peel strength measurement was performed according to DIN 53 494.

| | |
|---|---|
| Substrate: | 3.5 × 10 cm |
| Layer thickness: | 40 μm ± 4 μm |
| Test strip: | 10 mm in width, drawn to a distance of 50 mm. |
| Peeling rate: | 75 mm/min. |

What is claimed is:

1. A process for coating a substrate having polymer surfaces with metal in the manufacturing of printed circuit having micro holes and fine geometries comprising application of an electroconductive polymer layer to the substrate surfaces and a subsequent electrolytic metallization, wherein the electroconductive polymer layer is doped with a tin-containing, colloidal palladium solution prior to the electrolytic metallization step, the electroconductive polymer is poly-3,4-ethylenedioxythiophene, and a contacting with a copper (II) salt solution is performed prior to the electrolytic metallization.

2. The process according to claim 1, characterized in that the substrate surfaces are subjected to the following steps at least once prior to the application of the electroconductive polymer layer:

a) swelling by aqueous leaches, organic solvents, or alkaline solvents;
 b) treating with an alkaline permanganate solution; and
 c) treating with a reducing agent.

3. The process according to claim 1, characterized in that the substrate surfaces are mechanically roughened by means selected from the group consisting of brushing, sandblasting, pumice brushing, and pumice blasting prior to step a).

4. The process according to claim 1, characterized in that the process is performed horizontally.

5. The process according to claim 1, characterized in that the substrate surfaces are mechanically roughened by means selected from the group consisting of brushing, sandblasting, pumice brushing and pumice blasting prior to step a).

6. The process according to claim 2, characterized in that the process is performed horizontally.

7. The process according to claim 3, characterized in that the process is performed horizontally.

* * * * *

UNITED STATES PATENT AND TRADEMARK OFFICE
CERTIFICATE OF CORRECTION

PATENT NO. : 6,589,593 B1
DATED : July 8, 2003
INVENTOR(S) : Hupe et al.

It is certified that error appears in the above-identified patent and that said Letters Patent is hereby corrected as shown below:

Title page,
Item [57], ABSTRACT,
Line 7, change "zinc-coating" to -- tin-containing --.

Column 1,
Line 11, change "zinc-coating" to -- tin-containing --.

Column 6,
Line 27, change "1.5 EDT" to -- 1.5% EDT --.
Line 43, change "T: rt" to -- T: RG --.

Column 7,
Line 54, change "ABS" to -- ABC --.

Signed and Sealed this

Seventh Day of October, 2003

JAMES E. ROGAN
*Director of the United States Patent and Trademark Office*